United States Patent
Jang et al.

(10) Patent No.: US 10,361,718 B2
(45) Date of Patent: Jul. 23, 2019

(54) APPARATUS AND METHOD FOR ENCODING WITH CYCLIC REDUNDANCY CHECK AND POLAR CODE

(71) Applicants: Samsung Electronics Co., Ltd., Suwon-si, Gyeonggi-do (KR); Research & Business Foundation Sungkyunkwan University, Suwon-Si, Gyeonggi-do (KR)

(72) Inventors: Min Jang, Seongnam-si (KR); Sang-Hyo Kim, Seongnam-si (KR); Jong-Hwan Kim, Suwon-si (KR); Min Young Chung, Seoul (KR); Hyunseok Ryu, Yongin-si (KR); Wonjun Hwang, Suwon-si (KR); Eun Chong Baek, Suwon-si (KR)

(73) Assignees: Samsung Electronics Co., Ltd., Suwon-si (KR); Research & Business Foundation Sungkyunkwan University, Suwon-si (KR)

( * ) Notice: Subject to any disclaimer, the term of this patent is extended or adjusted under 35 U.S.C. 154(b) by 26 days.

(21) Appl. No.: 15/611,725

(22) Filed: Jun. 1, 2017

(65) Prior Publication Data
US 2017/0353193 A1    Dec. 7, 2017

(30) Foreign Application Priority Data
Jun. 1, 2016   (KR) .................. 10-2016-0068062

(51) Int. Cl.
*H03M 13/13*    (2006.01)
*H03M 13/09*    (2006.01)
*H03M 13/29*    (2006.01)

(52) U.S. Cl.
CPC ......... *H03M 13/091* (2013.01); *H03M 13/13* (2013.01); *H03M 13/2906* (2013.01); *H03M 13/09* (2013.01)

(58) Field of Classification Search
CPC ................................................. H03M 13/2957
USPC ............... 714/755, 756, 757, 758, 759, 762
See application file for complete search history.

(56) References Cited

U.S. PATENT DOCUMENTS

| 2014/0019820 A1 | 1/2014 | Vardy et al. |
| 2014/0169388 A1 | 6/2014 | Jeong et al. |

(Continued)

OTHER PUBLICATIONS

International Search Report and Written Opinion for PCT Application No. PCT/KR2017/005722, dated Sep. 12, 2017 (11 pages).

(Continued)

*Primary Examiner* — Fritz Alphonse

(57) ABSTRACT

The present disclosure relates to a pre-$5^{th}$-Generation (5G) or 5G communication system to be provided for supporting higher data rates Beyond $4^{th}$-Generation (4G) communication system such as Long Term Evolution (LTE). An operation method of a receiving device in a wireless system includes receiving a polar codeword generated by a polar code, generating a majority of decoding paths by decoding a bit value corresponding to one index that is selected among a majority of indexes indicating respective bits included in the polar codeword, determining a first candidate group that includes at least one decoding path among the majority of decoding paths, and determining, as a second candidate group, at least one decoding path passing a CRC check among the first candidate group. A number of the at least one decoding path included in the first candidate group is determined based on a result of a CRC check performed prior to the CRC check.

20 Claims, 17 Drawing Sheets

(56) References Cited

U.S. PATENT DOCUMENTS

| | | | |
|---|---|---|---|
| 2014/0173376 A1 | 6/2014 | Jeong et al. | |
| 2014/0365842 A1 | 12/2014 | Li et al. | |
| 2015/0263767 A1 | 9/2015 | Shin et al. | |
| 2017/0331577 A1* | 11/2017 | Parkvall | H04J 11/0079 |
| 2017/0331585 A1* | 11/2017 | Lin | H03M 13/4115 |
| 2017/0331670 A1* | 11/2017 | Parkvall | H04J 11/0079 |

OTHER PUBLICATIONS

Guiping Li, et al., "An Efficient Construction and Low Complexity Collaborative Decoding of Reed-Solomon Concatenated with Modified Polar Codes", Journal of Communications, vol. 10, No. 3, pp. 178-184, Mar. 31, 2015, (https://222.semanticscholar.org/paper/An-Efficient-Construction-and-Low-Comelexity-Colla-Li-Mu/4c7b63a0f7ab1beb8412b33f3b8176e003e5dd7) (9 pages).

Arikan, E., "Polar Coding: Status and Prospects", IEEE International Symposium on Information Theory, ISIT 2011, Saint Petersburg, Russia, Aug. 1, 2011, 151 pages.

Arikan, E., "Channel polarization: A method for constructing capacity-achieving codes for symmetric binary-input memoryless channels", IEEE Transactions on Information Theory, vol. 55, No. 7, Jul. 2009, pp. 3051-3073.

Tal, I. and Vardy, A., "List decoding of polar codes," IEEE Transactions on Information Theory, vol. 61, No. 5, May 2015, pp. 2213-2226.

Guo, J. et al., "Multi-CRC Polar Codes and Their Applications", IEEE Communication Letters, vol. 20, No. 2, Feb. 2016, pp. 212-215.

* cited by examiner

SELECT PATH OF HIGHEST METRIC

SELECT ALL PATHS PASSING CRC

APPARATUS AND METHOD FOR ENCODING WITH CYCLIC REDUNDANCY CHECK AND POLAR CODE

CROSS-REFERENCE TO RELATED APPLICATION(S) AND CLAIM OF PRIORITY

The present application is related to and claims priority under 35 U.S.C. § 119(a) to a Korean Patent Application entitled "apparatus and method for encoding with cyclic redundancy check and polar code" filed in the Korean Intellectual Property Office on Jun. 1, 2016 and assigned Serial No. 10-2016-0068062, the contents of which are herein incorporated by reference.

TECHNICAL FIELD

The following description generally relates to encoding and decoding and, in more detail, relates to an apparatus and method for encoding and decoding with a Cyclic Redundancy Check (CRC) and a polar code.

BACKGROUND

To meet the demand for wireless data traffic having increased since deployment of $4^{th}$ generation (4G) communication systems, efforts have been made to develop an improved $5^{th}$ generation (5G) or pre-5G communication system. Therefore, the 5G or pre-5G communication system is also called a 'Beyond 4G Network' or a 'Post Long Term Evolution (LTE) System'.

The 5G communication system is considered to be implemented in higher frequency (mmWave) bands, e.g., 28 GHz or 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems.

In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like.

In the 5G system, Hybrid frequency shift keying (FSK) and quadrature amplitude modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

A polar code is being considered as one channel code for 5G communication. The polar code can provide error rate performance that is comparable with those of a turbo code and a Low Density Parity Check (LDPC) code. The polar code demands a great number of operations compared to the turbo code and the LDPC code, due to a sequential algorithm.

SUMMARY

To address the above-discussed deficiencies, it is a primary object to provide an apparatus and method for performing encoding and decoding with a CRC and a polar code.

An operation method of a receiving device in a wireless system according to one exemplary embodiment includes receiving a polar codeword generated by a polar code, generating a majority of decoding paths by decoding a bit value corresponding to one index that is selected among a majority of indexes indicating respective bits included in the polar codeword, determining a first candidate group that includes at least one decoding path among the majority of decoding paths, and determining, as a second candidate group, at least one decoding path passing a Cyclic Redundancy Check (CRC) check among the first candidate group. A number of the at least one decoding path included in the first candidate group is determined based on a result of a CRC check performed prior to the CRC check.

A receiving device in a wireless system according to one exemplary embodiment may include a transceiver configured to receive a signal from a transmitting device, and at least one processor operatively combined with the transceiving unit. The at least one processor is configured to receive a polar codeword generated by a polar code, generate a majority of decoding paths by decoding a bit value corresponding to one index that is selected among a majority of indexes indicating respective bits included in the polar codeword, and is determine a first candidate group that includes at least one decoding path among the majority of decoding paths, and is configured to determine, as a second candidate group, at least one decoding path passing a Cyclic Redundancy Check (CRC) check among the first candidate group. The number of the at least one decoding path included in the first candidate group is determined based on a result of a CRC check performed prior to the CRC check.

A transmitting device in a wireless system according to one exemplary embodiment includes a transceiver configured to perform communication with a receiving device, and at least one processor operatively combined with the transceiver. The at least one processor is configured to generate a majority of bit groups by dividing input information bits every predefined count, generate a first CRC codeword by performing CRC encoding on a first bit group among the majority of bit groups, concatenate a second bit group among the majority of bit groups and the first CRC codeword, and generate a second CRC codeword by performing the CRC encoding on the first CRC codeword that the second bit group is concatenated with.

An operation method of a transmitting device in a wireless system according to one exemplary embodiment includes generating a majority of bit groups by dividing input information bits every predefined count, generating a first CRC codeword by performing CRC encoding on a first bit group among the majority of bit groups, concatenating a second bit group among the majority of bit groups and the first CRC codeword, and generating a second CRC codeword by performing the CRC encoding on the first CRC codeword that the second bit group is concatenated with.

The above exemplary embodiments and other exemplary embodiments may be understood together with a detailed description mentioned below and the drawings. But, the detailed description mentioned below is an exemplary means for explaining preferred exemplary embodiments and various detailed items thereof, and do not limit the scope of the exemplary embodiments. Various modifications and changes may be made within the scope of the exemplary embodiments.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

FIGS. 1 through 16B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged electronic device.

The terms used in the present disclosure are to just describe specific exemplary embodiments, and may have not an intention to limit the scope of other exemplary embodiments. The expression of a singular form may include the expression of a plural form unless otherwise dictating clearly in context. The terms used herein including the technological or scientific terms may have the same meanings as those commonly understood by a person having ordinary skill in the art mentioned in the present disclosure. Among the terms used in the present disclosure, the terms defined in a general dictionary may be construed as the same or similar meanings as the contextual meanings of a related technology, and are not construed as ideal or excessively formal meanings unless defined clearly in the present disclosure. According to cases, even the terms defined in the present disclosure may not be construed as excluding exemplary embodiments of the present disclosure.

In various exemplary embodiments of the present disclosure described below, a hardware access method is explained as an example. However, the various exemplary embodiments of the present disclosure include a technology using all hardware and software and therefore, it is not that the various exemplary embodiments of the present disclosure exclude a software based access method.

Below, the present disclosure explains an apparatus and method for encoding and decoding with a multiple Cyclic Redundancy Check (CRC) code and a polar code. The terms used below are terms exemplified for description convenience. Accordingly, the present disclosure is not limited to the terms described later, and may use other terms having equivalent technological meanings.

Figure 1:
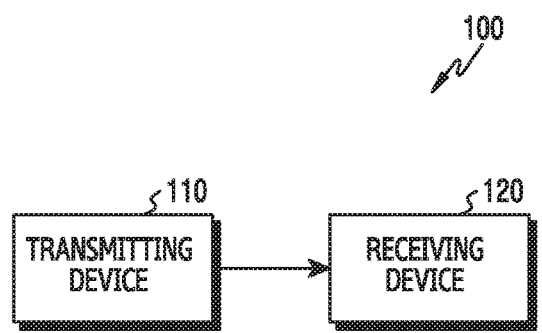
FIG. 1 illustrates a wireless communication system.

FIG. 1 illustrates a wireless communication system 100.

Referring to FIG. 1, the system 100 includes a transmitting device 110 and a receiving device 120. The transmitting device 110 and the receiving device 120 may correspond to user devices or network devices. The user device may include a terminal, a mobile station, a user equipment, etc. The network device may include a base station, a node B, an evolved node B (e-node B), etc. For example, the transmitting device 110 and the receiving device 120 may all correspond to terminals. For another example, the transmitting device 110 may correspond to a terminal, and the receiving device 120 may correspond to a base station.

The transmitting device 110 transmits a signal including data to the receiving device 120. In one exemplary embodiment, the transmitting device 110 may transmit the signal to the receiving device 120 in a super high frequency (mm-Wave) band. For the purpose of the mitigation of a propagation path loss in the super high frequency band and the increase of a propagation distance of a radio wave, the transmitting device 110 may use beamforming, massive Multi Input Multi Output (MIMO), Full Dimensional (FD) MIMO technologies, etc.

To increase the error rate performance of data that may be transmitted through a channel, the transmitting device 110 may use various encoding and decoding techniques. For example, the transmitting device 110 may perform encoding and decoding with a Low Density Parity Check (LDPC) code and a turbo code. For another example, the transmitting device 110 may perform encoding and decoding with a polar code.

The decoding with the polar code is characterized by using a Successive Cancellation (SC) decoding algorithm. According to the SC decoding algorithm, a decoder sequentially decodes information bits, one per bit. Here, the information bits construct data that the transmitting device 110 is to transmit to the receiving device 120. The SC decoding may be performed independently of a CRC, but the SC decoding may be performed along with a CRC code so as to provide error rate performance that is comparable with those of an LDPC and a turbo code. The SC decoding performed along with the CRC code is called a CRC Aided SC List (CA-SCL) decoding method. Below, a decoding method described in the detailed description of the invention and the drawings corresponds to the CA-SCL decoding method.

The CRC code is a code for, when data is transmitted in a wired or wireless network environment, checking if there is an error in the transmitted data. The transmitting device 110 adds the CRC code to transmission data (i.e., performs CRC encoding for the transmission data) and transmits to the receiving device 120 the data to which the CRC code is added. After the receiving device 120 receives the data to which the CRC code is added, the receiving device 120 may use the CRC code to check the existence or non-existence of an error of the data (i.e., performs a CRC check).

The following descriptions provide an encoding and decoding operation method of a polar code with a single CRC in FIG. 2A to FIG. 3B. The method includes the process of performing encoding and decoding by using one CRC code. Also, the following descriptions provide an encoding and decoding operation method of a polar code with a multiple CRC in FIG. 4 and FIGS. 5A to 5C. The method includes the process of dividing one CRC code into a constant count, and performing a CRC check by using the divided CRC codes. Also, the following descriptions provide another encoding and decoding operation method of a polar code with a multiple CRC in FIG. 6 and FIGS. 7A to 7C.

Figure 2A:
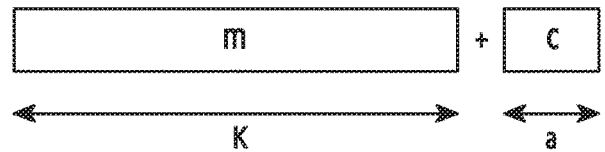
FIGS. 2A to 2C illustrate an encoding method of a polar code using a single CRC.
Figure 2B:
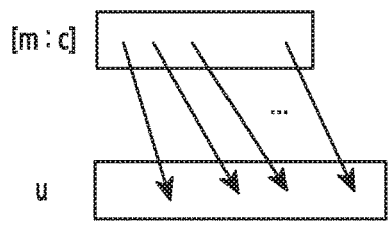
Figure 2C:
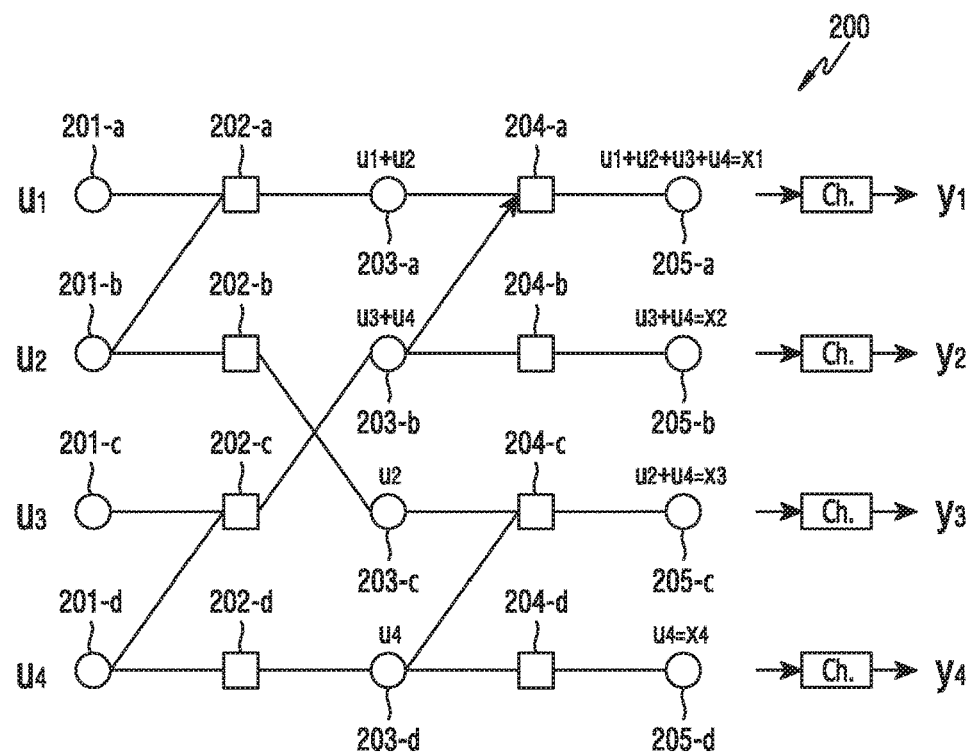

FIGS. 2A to 2C illustrate an encoding method of a polar code using a single CRC. FIGS. 2A to 2C illustrate a series of operations in which the transmitting device 110 performs CRC encoding and polar encoding, and each operation is successively performed.

Referring to FIG. 2A, the transmitting device 110 performs CRC encoding on inputted information bits (or an information bit sequence). In FIG. 2A, 'm' denotes the inputted information bits, and 'c' denotes a CRC code. The 'm' and the 'c' are all binary row vectors consisting of 0 and 1. Also, in FIG. 2A, the 'K' denotes a length of the inputted information bits (or the number of bits included in the information bit sequence), and the 'a' denotes a length of the CRC code (or the number of bits). In other words, the transmitting device 110 generates a CRC codeword of size 1×(K+a) by concatenating the information bit m=($m_0$, $m_1$, ..., $m_{k-1}$) of size 1×K and the CRC code c=($c_0$, $c_1$, ..., $c_{a-1}$) of size 1×a.

Referring to FIG. 2B, the transmitting device 110 converts the CRC codeword of size 1×(K+a) into a binary u vector of size 1×N, before performing polar encoding. Here, the 'N' denotes a length of the u vector (or the number of bits), and the 'N' is a value corresponding to a length of the polar code. The 'N' may be decided based on a coding rate 'R' of the transmitting device 110 and the length 'K' of the information bits. The coding rate 'R' may be expressed by K/N. Also, the 'N' is a number greater than K+a. In other words, the u vector includes an 'N' number of constituent elements, and the CRC encoded bits are mapped to a K+a number of constituent elements among the 'N' number of the constituent elements, and the remaining constituent elements are mapped to a value 0.

The transmitting device 110 performs polar encoding on the u vector. For example, the polar encoding may be expressed in Equation 1 below.

$$uG_N = x \quad \text{[Equation 1]}$$

In the Equation 1, the '$G_N$' denotes a polar code generator matrix of size N×N, and the 'x' denotes a codeword vector of size 1×N. For example, if the coding rate 'R' of the polar encoding performed in the transmitting device 110 is ½ and the length 'K' of the inputted information bit is 2, because the 'N' value is 4, the polar code generator matrix may be expressed by a matrix as in Equation 2 below.

$$G_4 = \begin{bmatrix} 1 & 0 & 0 & 0 \\ 1 & 0 & 1 & 0 \\ 1 & 1 & 0 & 0 \\ 1 & 1 & 1 & 1 \end{bmatrix} \quad \text{[Equation 2]}$$

In the Equation 2, the '$G_4$' denotes a polar code generator matrix of size 4×4.

FIG. 2C illustrates a polar encoding operation by a bipartite graph. An operation mentioned in the Equation 1 may be expressed by the bipartite graph illustrated in FIG. 2C. Referring to FIG. 2C, a graph 200 includes variable nodes 201-a to 201-d, 203-a to 203-d, and 205-a to 205-d, and operation nodes 202-a to 202-d and 204-a to 204-d. Each of the variable nodes represents a node to which a constituent element of the u vector or a result value of the operation is inputted. Each of the operation nodes represents a node in which an operation between values of the variable nodes is performed. Though not concretely illustrated in FIG. 2C, an operation equation inputted to each of the operation nodes may be various in accordance with the polar code generator matrix ($G_N$). The constituent elements of the u vector inputted to the graph 200 are encoded into constituent elements of a codeword vector (x) through a sequential operation process, and the process proceeds from the left to the right.

For example, in a case of N=4, the constituent elements $u_1$, $u_2$, $u_3$ and $u_4$ of the u vector are inputted to the variable nodes 201-a to 201-d, respectively. The $u_1$, $u_2$, $u_3$ and $u_4$ each consist of 0 or 1. The transmitting device 110 performs an operation for a value $u_1$ and a value $u_2$ at the variable node 202-a (in this case, an operation symbol of an operation equation inputted to the operation node 202-a is (+)). As a result, a value $u_1+u_2$ is decided at the variable node 203-a. In the same manner, the transmitting device 110 performs an operation for the value $u_1+u_2$ inputted to the variable node 203-a and a value $u_3+u_4$ decided at the variable node 203-b at the operation node 204-a (in this case, an operation symbol of an operation equation inputted to the operation node 204-a is (+)). As a result, a value $u_1+u_2+u_3+u_4$ is decided at the variable node 205-a. In the same manner, the transmitting device 110 generates result values at the variable nodes 205-b to 205-d.

The values inputted to the variable nodes 205-a to 205-d represent the constituent elements of the codeword vector 'x', respectively. As illustrated in FIG. 2C, the transmitting device 110 transmits the generated codeword vector 'x' to the receiving device 120 through a channel. The receiving device 120 receives a partially or entirely distorted signal through the channel. In FIG. 2C, constituent elements of a polar codeword vector 'y' included in the received signal are denoted by $y_1$, $y_2$, $y_3$ and $y_4$, respectively.

Figure 3A:
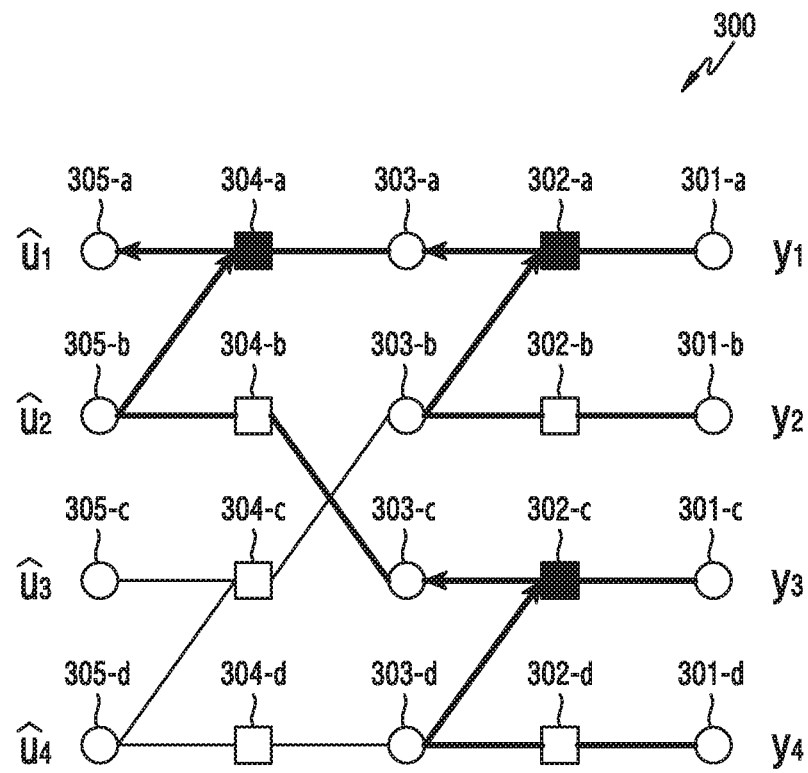
FIGS. 3A and 3B illustrate a decoding method of a polar code using a single CRC.
Figure 3B:
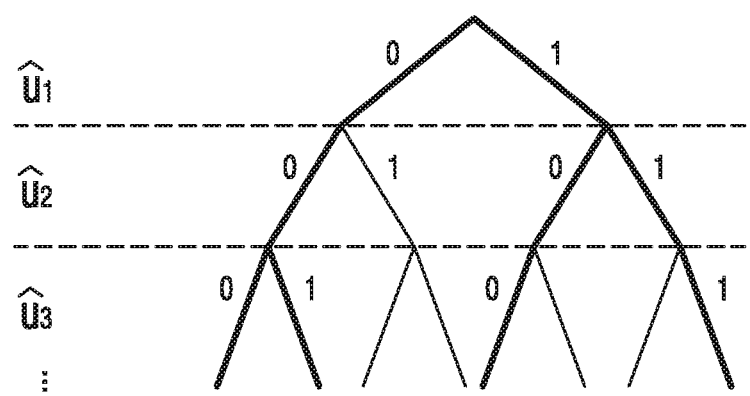

FIGS. 3A and 3B illustrate a decoding method of a polar code using a single CRC. FIGS. 3A and 3B illustrate a series of operations in which the receiving device 120 performs decoding. The respective operations may be successively performed or, while an operation illustrated in FIG. 3A is performed, an operation illustrated in FIG. 3B may be concurrently performed.

The receiving device 120 performs a decoding operation in accordance with a scheme illustrated in FIG. 3A. A graph 300 includes variable nodes 301-a to 301-d, 303-a to 303-d, and 305-a to 305-d, and operation nodes 302-a to 302-d and 304-a to 304-d. A series of operation schemes performed in FIG. 3A is similar with a series of operation schemes illustrated in FIG. 2C. But, values (or operation equations) respectively inputted to the variable nodes and the operation nodes included in the graph 300 are different from values (or operation equations) respectively inputted to the variable nodes and the operation nodes included in the graph 200. An operation process proceeds from the right to the left. For example, constituent elements $y_1$, $y_2$, $y_3$ and $y_4$ of a polar codeword vector 'y' are inputted to the variable nodes 301-a to 301-d, respectively. The receiving device 120 decides a value of the variable node 303-a by using a value $y_1$ of the variable node 301-a, a value $y_2$ of the variable node 301-b and the operation node 302-a. Here, an operation equation $(y_1y_2)/(y_1+y_2)$ may be inputted to the operation node 302-a. An operation equation is decided based on the decided polar code generator matrix ($G_N$) and an inputted information bit sequence, and a concrete proof process is omitted. In the above manner, the receiving device 120 decides a value $\hat{u}_1$ by using the variable node 303-a and variable node 305-b and the operation node 304-a.

The value $\hat{u}_1$ is a bit value corresponding to an index of a constituent element $u_1$ of a u vector that is generated in the transmitting device 110. The value $\hat{u}_1$ may be the same as a value $u_1$ or not be the same in accordance with a distortion degree of a signal transmitted through a channel. Accordingly, the receiving device 120 generates a decoding path for the value $\hat{u}_1$ in accordance with the scheme illustrated in FIG. 3B. The decoding path represents candidates (i.e., 0 or 1) that may become the value $\hat{u}_1$. In other words, the receiving device 120 decides a probability in which each of the candidates is actually the same value as the value $u_1$ through a decoding process. A probability value may be shown by metrics of various forms. The metric may be expressed by a likelihood or a Log Likelihood Ratio (LLR) in accordance with an implementation method. After the receiving device 120 decides the candidates for the value $\hat{u}_1$, the receiving device 120 decides candidates for a next value (for example, a value $\hat{u}_2$ or $\hat{u}_3$) by performing decoding sequentially.

By performing a decoding operation for each of bit values corresponding to indexes, the receiving device 120 generates candidates for each of the bit values corresponding to the indexes. If so, as illustrated in FIG. 3B, a majority of decoding paths are generated. The decoding paths represent a candidate group that is generated by decoding a majority of bit values. The receiving device 120 generates two decoding paths whenever decoding on one bit value is performed. For example, decoding paths (or a candidate group) [$\hat{u}_1$, $\hat{u}_2$]=[0,0],[0,1],[1,0],[1,1] are generated after decoding on $\hat{u}_2$ or $\hat{u}_3$ is performed.

Whenever the number of bits for decoding is increased, the number of decoding operations is increased. Therefore, to prevent the limitless increase of the number of decoding operations, the receiving device 120 maintains a predetermined reference value (hereinafter, named a List (L)) while generating the decoding paths. The 'L' value may be various values in accordance with an implementation method.

For example, FIG. 3B assumes a case where L=4. If the receiving device 120 sequentially performs decoding on values $\hat{u}_1$ to $\hat{u}_3$, a total of eight decoding paths are generated. To meet the predetermined 'L' value, the receiving device 120 maintains four decoding paths among the generated eight decoding paths based on the metric, and cancels the remaining four decoding paths among the eight decoding paths. In the present disclosure, the canceled decoding paths represent decoding paths in which a new decoding path is no longer generated through decoding.

For example, the receiving device 120 may select four decoding paths of the highest likelihood (or four decoding paths of the highest LLR) among the generated eight decoding paths. The four decoding paths selected in FIG. 3B are [$\hat{u}_1$, $\hat{u}_2$, $\hat{u}_3$]=[0, 0, 0],[0, 0, 1],[1, 0, 0],[1, 1, 1]. When the receiving device 120 performs decoding on $\hat{u}_4$, the receiving device 120 no longer generates additional candidates for decoding paths [0, 1, 0], [0, 1, 1], [1, 0, 1], and [1, 1, 0] that have been canceled in the previous process.

Though not illustrated in FIG. 3B, the receiving device 120 performs a CRC check for an L number of decoding paths that are decided by performing decoding on all the bit values corresponding to the indexes. The number of decoding paths passing the CRC check may be 0 or 4 in accordance with a distortion degree of a signal that is received through a channel. If the number of decoding paths passing the CRC check is 2 or more, the receiving device 120 selects one decoding path of the highest metric among the decoding paths.

Though not illustrated in FIG. 3B, the receiving device 120 performs a CRC check for an L number of decoding paths that are decided by performing decoding on all the bit values corresponding to the indexes. The number of decoding paths passing the CRC check may be 0 or 4 in accordance with a distortion degree of a signal that is received through a channel. If the number of decoding paths passing the CRC check is 2 or more, the receiving device 120 selects one decoding path of the highest metric among the decoding paths.

Figure 4:
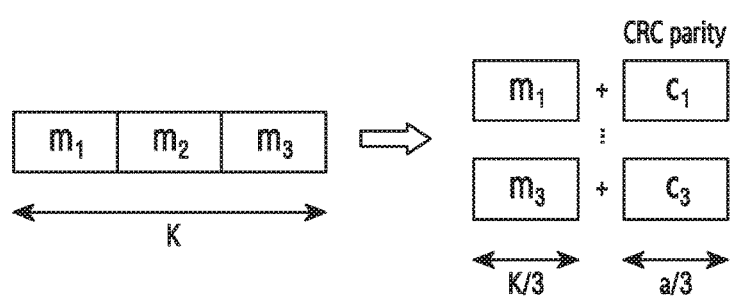
FIG. 4 illustrates a CRC encoding method of a polar code using a multiple CRC.

FIG. 4 illustrates a CRC encoding method of a polar code using a multiple CRC.

Referring to FIG. 4, the transmitting device 110 divides inputted information bits every constant count, thereby generating an M number of sub blocks ($m_1$, $m_2$ and $m_3$). The number of divided information bits or the number (M) of the sub blocks may be decided variously according to a length of a polar code, a coding rate, a length of an information bit sequence, etc. For example, as illustrated in FIG. 4, the transmitting device 110 may generate three sub blocks by dividing information bits whose length is 'K'. The lengths of the generated sub blocks are K/3 respectively. Also, the transmitting device 110 may generate three CRC code blocks by dividing a CRC code. The lengths of the generated CRC code blocks are a/3 respectively.

The transmitting device 110 performs CRC encoding independently for the generated three sub blocks. Though not illustrated in FIG. 4, the transmitting device 110 generates one CRC codeword of length K+a by concatenating, in series, blocks each having a length (K+a)/3 that are generated by performing the CRC encoding.

Though not illustrated in FIG. 4, after the transmitting device 110 converts the generated CRC codeword into a u vector, the transmitting device 110 performs polar encoding with the u vector and a polar code. The conversion process and the polar encoding operation are performed identically with the operation depicted in FIG. 2B and FIG. 2B.

The receiving device 120 uses a polar codeword received from the transmitting device 110, to perform encoding of a polar code using a multiple CRC. A concrete operation process of sequentially decoding bit values (e.g., $\hat{u}_1$, $\hat{u}_2$, $\hat{u}_3$) corresponding to indexes of input information bits is identical with the scheme depicted in FIG. 3A.

Figure 5A:
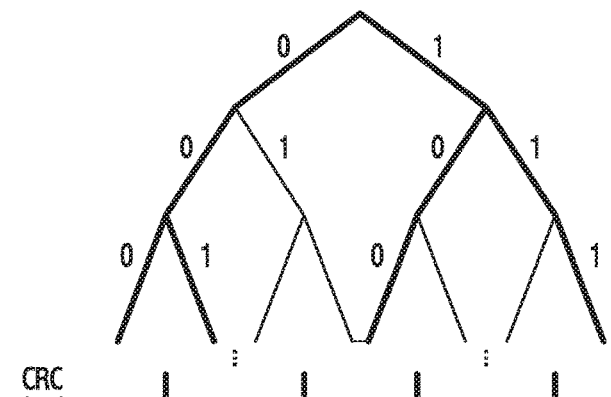
FIGS. 5A to 5C illustrate a method of deciding a decoding path of a polar code using a multiple CRC.
Figure 5B:
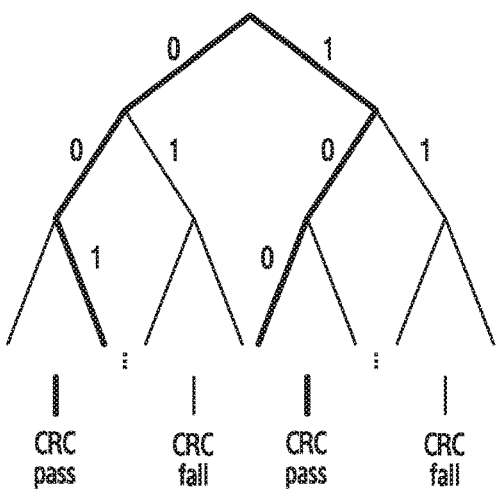
Figure 5C:
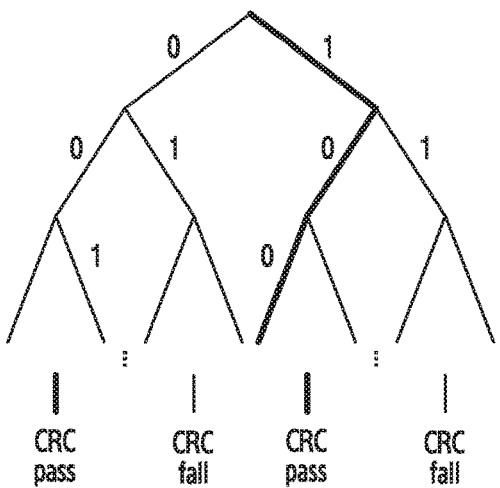

FIGS. 5A to 5C illustrate a method of deciding a decoding path of a polar code using a multiple CRC.

Unlike that the receiving device 120 performs a CRC check after performing all decoding in the decoding method of the polar code using the single CRC, the receiving device 120 performs the CRC check whenever decoding on a constant number of bits is performed in the decoding method of the polar code using the multiple CRC. For example, if the transmitting device 110 divides input information bits into three sub blocks and performs CRC encoding on each of the sub blocks as illustrated in FIG. 4, the receiving device 120 may perform the CRC check whenever the receiving device 120 performs decoding on one block (e.g., $m_1$) among the sub blocks. For another example, as illustrated in FIGS. 5A to 5C, the receiving device 120 may perform the CRC check whenever decoding on three bits is performed.

Referring to FIG. 5A, the receiving device 120 maintains the number of decoding paths as four (i.e., L=4) while sequentially performing decoding. In FIG. 5A, the number of decoding paths that are generated after the receiving device 120 performs decoding on the $\hat{u}_1$, $\hat{u}_2$, $\hat{u}_3$ is totally eight, and the decoding paths remaining through a cancellation process based on a metric are [0, 0, 0], [0, 0, 1], [1, 0, 0] and [1, 1, 1]. If the decoding on the $\hat{u}_1$, $\hat{u}_2$, $\hat{u}_3$ is performed, the receiving device 120 performs a CRC check for the generated four decoding paths. The number of decoding paths passing the CRC check may be various according to a distortion degree of a transmitted signal. For example, if there is not the decoding path passing the CRC check, the receiving device 120 no longer performs the decoding. For another example, if the decoding path passing the CRC check is one in number, the receiving device 120 continuously performs decoding on the one decoding path passing the CRC check. For further example, as illustrated in FIG. 5B, two decoding paths [0, 0, 1] and [1, 0, 0] may pass the CRC check, and the remaining two decoding paths may fail to pass the CRC check. In this case, the receiving device 120 cancels the two decoding paths failing to pass the CRC check. In other words, the receiving device 120 no longer performs decoding on the canceled decoding paths.

As illustrated in FIG. 5C, the receiving device 120 selects one decoding path of the highest metric among the two decoding paths passing the CRC check. For example, if the likelihood or LLR of the decoding path [1, 0, 0] is highest, the receiving device 120 may select the decoding path [1, 0, 0], and cancel the other decoding path [0, 0, 1].

Though not illustrated in FIGS. 5A to 5C, the receiving device 120 performs the following procedure for the selected one decoding path in the same scheme as that of the process earlier depicted in FIGS. 5A to 5C. That is, the receiving device 120 sequentially performs decoding from $\hat{u}_4$, with maintaining the decoding path [1, 0, 0]. If the number of decoding paths exceeds a predefined reference value 'L' (e.g., L=4) in the decoding execution process, the receiving device 120 cancels decoding paths of a number exceeding the 'L' based on the metric. If decoding on $\hat{u}_6$ is performed, the receiving device 120 performs a CRC check for an 'L' number of decoding paths that are generated in the decoding process.

As mentioned above, because the decoding method of the polar code using the multiple CRC performs a CRC check after performing a constant number of decoding, the decoding method of the polar code using the multiple CRC requires the less number of decoding operations compared to the decoding method of the polar code using the single CRC. Also, if the CRC check result is that the decoding path passing the CRC check is 0 in number, the receiving device 120 may immediately terminate decoding. Therefore, fast decoding termination may occur in the decoding method. But, because a length of the multiple CRC code is shorter than a length of the single CRC code, the decoding method of the polar code using the multiple CRC shows a low error detection ability compared to the decoding method of the polar code using the single CRC.

Figure 6:
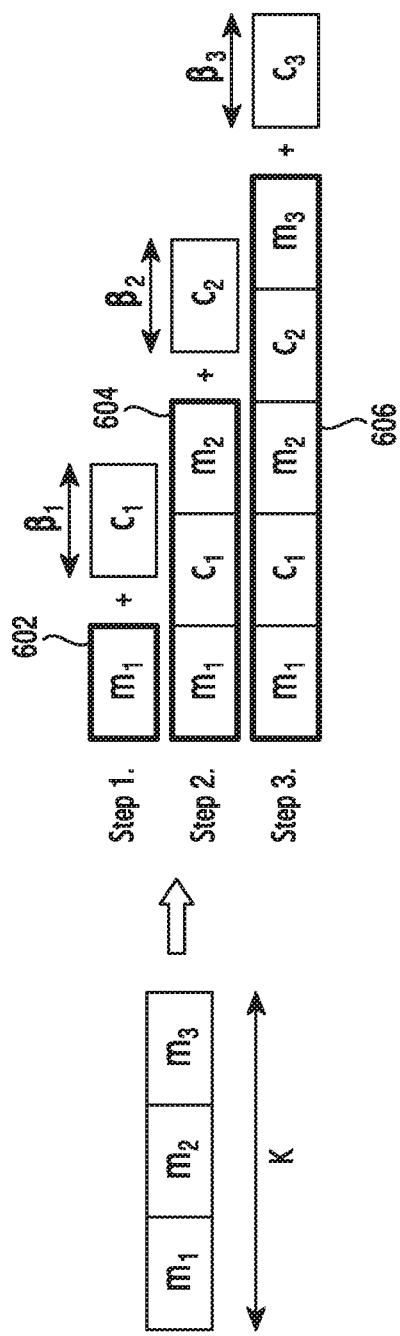
FIG. 6 illustrates a CRC encoding method according to one exemplary embodiment.

FIG. 6 illustrates a CRC encoding method according to one exemplary embodiment.

Referring to FIG. 6, the transmitting device 110 divides information bits every constant count, thereby generating an M number of sub blocks ($m_1$, $m_2$ and $m_3$). The number of divided information bits or the number (M) of sub blocks may be decided variously according to a length of a polar code, a coding rate, a length of an information bit sequence, etc. For example, as illustrated in FIG. 6, the transmitting device 110 may generate three sub blocks by dividing information bits whose length is 'K'. The lengths of the generated sub blocks are K/3 respectively.

The transmitting device 110 redundantly performs CRC encoding on the generated sub blocks. In the first step, the transmitting device 110 concatenates a CRC code ($c_1$) with the first sub block 602 (i.e., $m_1$). In the second step, the transmitting device 110 generates a block 604 (i.e., $m_1 c_1 m_2$) by concatenating the second sub block (i.e., $m_2$) to a block (i.e., $m_1 c_1$) on which the first CRC encoding is performed. And then, the transmitting device 110 redundantly concatenates a CRC code ($c_2$) with the block 604. In the third step, in the same manner as the second step, the transmitting device 110 generates one CRC codeword ($m_1 c_1 m_2 c_2 m_3 c_3$) by redundantly performing CRC encoding on a block 606 ($m_1 c_1 m_2 c_2 m_3$).

Though not illustrated in FIG. 6, after the transmitting device 110 converts the generated CRC codeword into a u vector, the transmitting device 110 performs polar encoding with the u vector and a polar code. The conversion process and the polar encoding operation are performed identically with the operation depicted in FIG. 2B and FIG. 2C. By the polar encoding process, a polar codeword is generated.

The receiving device 120 uses the polar codeword received from the transmitting device 110, to perform decoding of a polar code with a multiple CRC. A concrete operation process of sequentially decoding bit values (e.g., $\hat{u}_1$, $\hat{u}_2$, $\hat{u}_3$) corresponding to indexes of input information bits is the same as the scheme depicted in FIG. 3A.

Figure 7A:
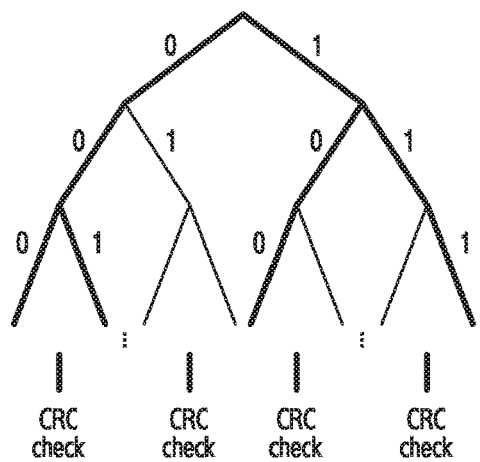
FIGS. 7A to 7C illustrate a method of deciding a decoding path in accordance with one exemplary embodiment.
Figure 7B:
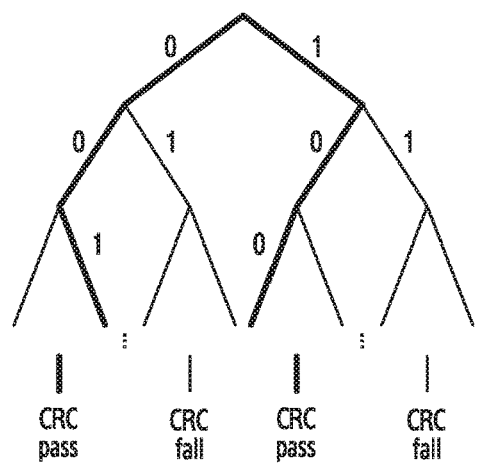
Figure 7C:
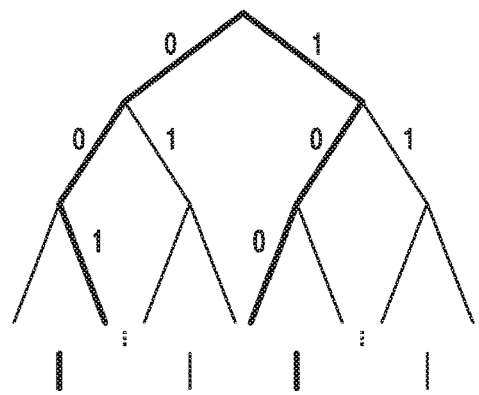

FIGS. 7A to 7C illustrate a method of deciding a decoding path in accordance with one exemplary embodiment.

The receiving device 120 performs a CRC check whenever decoding on a constant number of bits is performed identically with the scheme depicted in FIGS. 5A to 5C. For example, as illustrated in FIGS. 7A to 7C, the receiving device 120 may perform the CRC check whenever decoding on three bits is performed.

Referring to FIG. 7A, the receiving device 120 maintains the number of decoding paths as four (i.e., L=4) while sequentially performing decoding. In FIG. 7A, the number of decoding paths that are generated after the receiving device 120 performs decoding on the $\hat{u}_1$, $\hat{u}_2$, $\hat{u}_3$ is totally eight, and the decoding paths remaining through a cancellation process based on a metric are [0, 0, 0], [0, 0, 1], [1, 0, 0] and [1, 1, 1]. If the decoding on the $\hat{u}_1$, $\hat{u}_2$, $\hat{u}_3$ is performed, the receiving device 120 performs a CRC check for the generated four decoding paths. The number of decoding paths passing the CRC check may be various according to a distortion degree of a transmitted signal. For example, as illustrated in FIG. 7B, the two decoding paths [0, 0, 1] and [1, 0, 0] may pass the CRC check, and the remaining two decoding paths may fail to pass the CRC check. In this case, the receiving device 120 cancels the two decoding paths failing to pass the CRC check.

Referring to FIG. 7C, unlike that the receiving device 120 performs a next procedure for one decoding path that is selected based on the CRC check and the metric in FIGS. 5A to 5C, the receiving device 120 performs a next procedure for the two decoding paths [0, 0, 1] and [1, 0, 0] that are decided after the CRC check. That is, the receiving device 120 performs subsequent decoding on all the decoding paths passing the CRC check.

In this case, the receiving device 120 sets the number of decoding paths that are decided after the CRC check, as a new decoding path reference value (i.e., an 'L' value), and performs next decoding. For example, if the number of decoding paths that are decided through the CRC check is two as illustrated in FIG. 7C, the receiving device 120 sequentially performs decoding from $\hat{u}_4$ with maintaining the number of decoding paths as two. If the number of decoding paths exceeds two that is the number of newly decided decoding paths in the decoding execution process, the receiving device 120 cancels the number of decoding paths exceeding two based on the metric. If decoding on $\hat{u}_6$ is performed, the receiving device 120 performs a CRC check for the two decoding paths that are generated in the decoding process.

The receiving device 120 performs subsequent decoding on one decoding path that is selected based on a metric after the CRC check in accordance with the scheme depicted in FIGS. 5A to 5C, and the receiving device 120 performs subsequent decoding on all the decoding paths passing the CRC check in accordance with the scheme depicted in FIGS. 7A to 7C. But, in accordance with various exemplary embodiments, the receiving device 120 may select two or more decoding paths among the decoding paths passing the CRC check based on various reference values. In one exemplary embodiment, though not illustrated in FIGS. 7A to 7C, it is assumed that the number of decoding paths passing the CRC check is four. In this case, the receiving device 120 may select two decoding paths among the four decoding paths based on the metric. Also, the receiving device 120 may select three decoding paths among the four decoding paths based on the metric. Here, the number (i.e., two or three) of the selected decoding paths may be decided variously in accordance with an implementation method. For example, the number of the selected decoding paths may be predetermined in a design step. For another example, the number of the selected decoding paths may be adaptively decided based on the metric or decoding success rate of the decoding paths that are decided in the previous decoding step.

By using all the decoding paths passing the CRC, the mentioned scheme may provide a higher error detection ability compared to the decoding method of the polar code using the multiple CRC, whereas being capable of providing the low number of decoding operations because not increasing the decoding paths. But, because the decoding success rates (or channel capacities) for the respective bit values are different mutually in accordance with the generator matrix for the polar code in the design step, if a difference of the decoding success rates for the respective bit values is not considered, a method of maintaining the decoding path may rather provide a low error detection ability. Accordingly, a method applying the operation method based on the channel capacities for the respective bit values may be proposed as in the following description.

In the first step, before performing decoding, the receiving device 120 defines indexes by two groups, based on channel capacities (or decoding success rates) for respective bit values corresponding to indexes of input information bits (or bits included in a u vector). The two groups may be defined as a 1st group of high channel capacity (or high decoding success rate), and a 2nd group of low channel capacity (or low decoding success rate).

In the second step, the receiving device 120 performs decoding of a mutually different scheme for each group. In a case of the 1st group, the receiving device 120 may, as illustrated in FIGS. 7A to 7C, perform next decoding with no longer increasing the number of decoding paths that are decreased after a CRC check. Because the 1st group includes bits of high channel capacity, the receiving device 120 does not almost generate error rate performance degeneration even if the receiving device 120 does not increase the number of the decoding paths. In a case of the 2nd group, the receiving device 120 may, as illustrated in FIGS. 5A to 5C, perform next decoding with maintaining the number of decoding paths as a predetermined 'L'.

In the third step, if the last CRC check is performed, the receiving device 120 decides one decoding path of the highest metric among a majority of decoding paths passing the CRC check, by a bit value corresponding to the input information bit.

Also, the receiving device 120 may adaptively apply a method of maintaining the number of decoding paths in accordance with various implementation methods, besides the operation of grouping the indexes based on the channel capacity. For example, the receiving device 120 may decide whether to maintain the number of decoding paths on the basis of a result of decoding up to a previous bit. In more detail, the receiving device 120 may decide whether to maintain the number of decoding paths, based on a metric of the decoding paths decided in the previous decoding process. The metric may be various in accordance with an implementation method. For example, the metric may become a likelihood or an LLR. In this case, a concrete procedure of a method of maintaining the number of decoding paths based on the metric may be implemented as below.

In the first step, the receiving device 120 performs decoding on bit values corresponding to indexes, without grouping the indexes of the input information bits. Here, the receiving device 120 sets the number of decoding paths as a predetermined reference value (i.e., an 'L' value). For example, the receiving device 120 may set the number of decoding paths as L=4.

In the second step, the receiving device 120 decides the number of decoding paths for a subsequent decoding step, based on a metric for the decoding paths that are decided in the previously decoding step. For example, it is assumed that the number of decoding paths passing the CRC check is three after decoding is performed up to $\hat{u}_3$. If a metric of the three decoding paths passing the CRC check is less than a preset threshold value, the receiving device 120 may perform decoding on $\hat{u}_4$ with maintaining the number of decoding paths as L=4. If the metric of three decoding paths passing the CRC check is equal to or is greater than the preset threshold value, the receiving device 120 performs decoding on $\hat{u}_4$ with maintaining the number of decoding paths (i.e., with setting the number of decoding paths as three).

In the aforementioned exemplary embodiments, maintaining or non-maintaining the decoding path is determined on the basis of all the decoding paths passing the CRC check. But, in accordance with other exemplary embodiments, maintaining or non-maintaining the number of decoding paths may be determined by some of all the decoding paths passing the CRC check (e.g., a decoding path having the most excellent metric and a predefined number of decoding paths).

Figure 8:
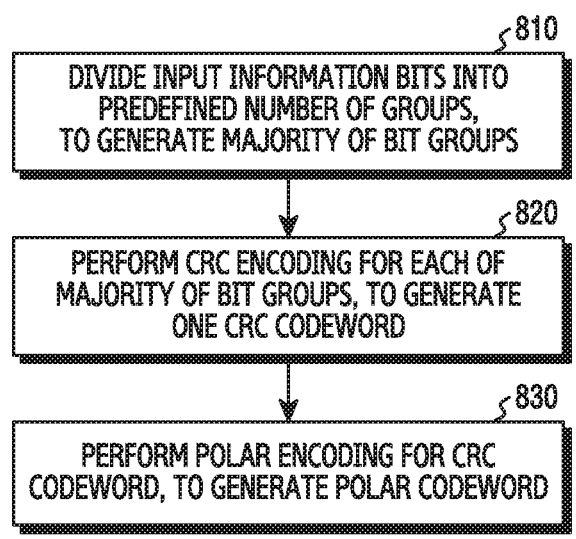
FIG. 8 illustrates a flow of an operation for encoding of a polar code according to one exemplary embodiment.

FIG. 8 illustrates a flow of an operation for encoding of a polar code according to one exemplary embodiment.

Referring to FIG. 8, in step 810, the transmitting device 110 divides input information bits into a predefined number of groups, to generate a majority of bit groups. For example, if a length of the input information bits is 'K' and the number of the bit groups is 'M', the transmitting device 110 may divide the input information bits every K/M number of bits.

In step 820, the transmitting device 110 performs CRC encoding on each of the majority of bit groups, thereby generating one CRC codeword. A scheme in which the CRC encoding is performed may be various in accordance with an implementation method. The scheme in which the CRC encoding is performed is depicted in a description of FIG. 9 and FIG. 10 below.

In step 830, the transmitting device 110 performs polar encoding on the CRC codeword, thereby generating a polar codeword. Thought not illustrated in FIG. 8, after the transmitting device 110 converts the CRC codeword into a u vector, the transmitting device 110 may perform the polar encoding. The length of the u vector is decided based on a coding rate and the length of the input information bits. Also, the u vector may additionally include a value 0 besides a constituent element included in the CRC codeword. Though not illustrated in FIG. 8, the transmitting device 110 transmits the generated polar codeword to the receiving device 120.

Figure 9:
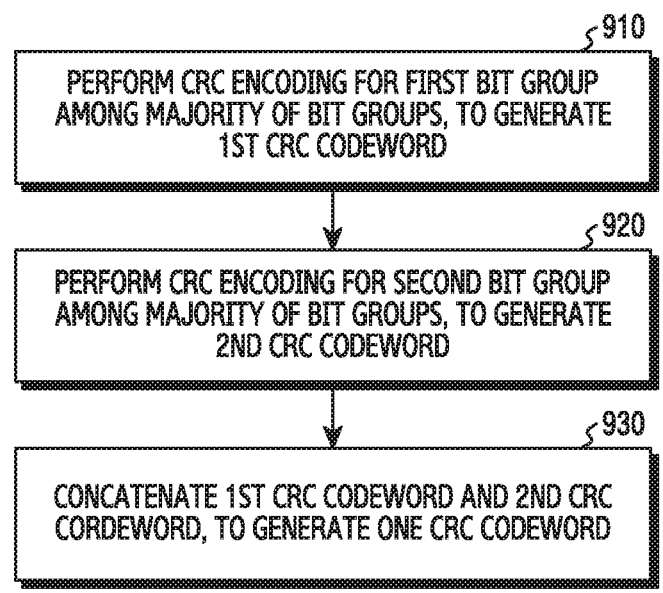
FIG. 9 illustrates a flow of an operation for CRC encoding according to one exemplary embodiment.

FIG. 9 illustrates a flow of an operation for CRC encoding according to one exemplary embodiment. The operation illustrated in FIG. 9 illustrates step 820 of FIG. 8 in more detail.

Referring to FIG. 9, in step 910, the transmitting device 110 generates a 1st CRC codeword by performing CRC encoding on the first bit group among the majority of bit groups. For example, the transmitting device 110 may generate the 1st CRC codeword by concatenating the first block among blocks of length K/M and a CRC code of length a/M.

In step 920, the transmitting device 120 generates a 2nd CRC codeword by performing CRC encoding on the second bit group among the majority of bit groups. The CRC encoding on the first bit group and the CRC encoding on the second bit group are performed independently, and any one encoding process does not affect the other encoding process.

In step 930, the transmitting device 110 generates one CRC codeword by concatenating the 1st CRC codeword and the 2nd CRC codeword in series.

Though not illustrated in FIG. 9, if the number of bit groups is 'n' ('n' is a natural number of 2 or more), the transmitting device 110 may generate an 'n' number of CRC codewords in the same scheme as that of step 910 and step 920. For example, if the 'n' is 5, the transmitting device 110 may generate a 3rd CRC codeword, a 4th CRC codeword and a 5th CRC codeword. Also, the transmitting device 110 may generate one CRC codeword by concatenating the generated five CRC codewords in series.

Figure 10:
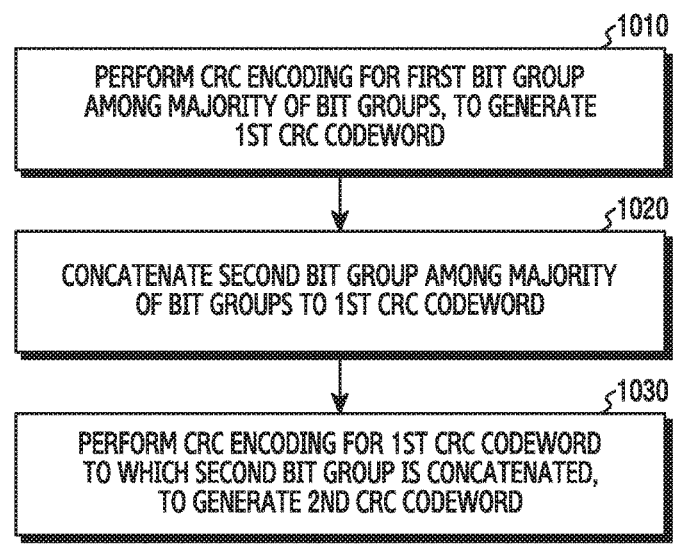
FIG. 10 illustrates a flow of an operation for CRC encoding according to another exemplary embodiment.

FIG. 10 illustrates a flow of an operation for CRC encoding according to another exemplary embodiment. An operation illustrated in FIG. 10 illustrates step 820 of FIG. 8 in more detail.

Referring to FIG. 10, in step 1010, the transmitting device 110 generates a 1st CRC codeword by performing CRC encoding on the first bit group among a majority of bit groups. For example, the transmitting device 110 may generate the 1st CRC codeword by concatenating the first bit group among the bit groups of length K/M and a CRC code of length a/M.

In step 1020, the transmitting device 110 concatenates the second bit group among the majority of bit groups to the 1st CRC codeword. In other words, the transmitting device 110 concatenates the second bit group and the 1st CRC codeword in series.

In step 1030, the transmitting device 110 generates a 2nd CRC codeword by performing CRC encoding on the 1st CRC codeword which the second bit group is concatenated with. FIG. 10 illustrates a process of redundantly performing CRC encoding for just two bit groups, but in accordance with an implementation method, the transmitting device 110 may redundantly perform CRC encoding for an 'n' number of bit groups.

Figure 11:
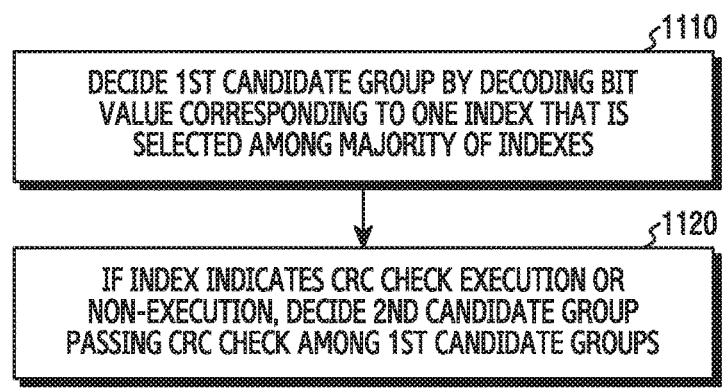
FIG. 11 illustrates a flow of an operation for decoding of a polar code according to one exemplary embodiment.

FIG. 11 illustrates a flow of an operation for decoding of a polar code according to one exemplary embodiment.

Referring to FIG. 11, in step 1110, the receiving device 120 decides a 1st candidate group by decoding a bit value corresponding one index that is selected among a majority of indexes. Here, the majority of indexes represent indexes corresponding to a majority of bits included in an input information bit sequence. Also, the 1st candidate group represents a decoding path that is decided by the CA-SCL decoding. In other words, the receiving device 120 decides decoding paths of bit values (e.g., $\hat{u}_1$, $\hat{u}_2$, $\hat{u}_3$) corresponding to indexes of input information bits, by performing decoding on constituent elements of a polar codeword vector 'y' received from the transmitting device 110. The number of a majority of candidates (i.e., decoding paths) included in the majority of 1st candidate groups may be various in accordance with an implementation method. For example, the number of the majority of candidates may correspond to a predefined reference value (i.e., 'L' value) or less. For another example, the number of the majority of candidates may be decided based on a result of a previously executed CRC check. In this case, if the number of decoding paths that are generated by performing a CRC check after the receiving device 120 decodes up to $\hat{u}_3$ is two, the receiving device 120 maintains the number of decoding paths as two in a subsequent decoding step.

In step 1120, if the receiving device 120 performs a defined number of decoding, the receiving device 120 may decide a 2nd candidate group passing the CRC check among the 1st candidate group. Here, the number of a majority of candidates included in the 2nd candidate group may be various in accordance with a channel state in which a signal is received. Candidates failing to pass the CRC check are canceled. Though not illustrated in FIG. 11, if the number of candidates included in the 2nd candidate group after the CRC check is zero, the receiving device 120 terminates the decoding operation.

Figure 12:
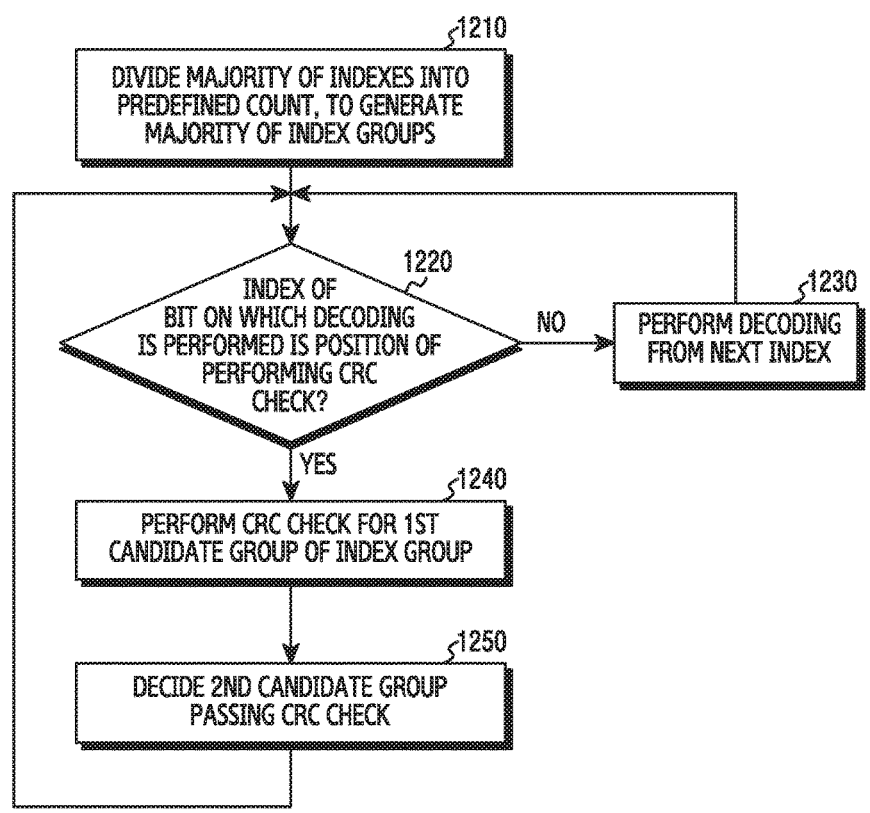
FIG. 12 illustrates a flow of a detailed operation for decoding of a polar code according to one exemplary embodiment.

FIG. 12 illustrates a flow of a detailed operation for decoding of a polar code according to one exemplary embodiment. FIG. 12 illustrates an operation of repeatedly performing step 1110 and step 1120 of FIG. 11.

Referring to FIG. 12, in step 1210, the receiving device 120 generates a majority of index groups, by dividing a majority of indexes into a constant count. The receiving device 120 performs a CRC check by the unit of the generated majority of index groups. The number of the majority of index groups may be decided based on a length of an input information bit sequence and a coding rate. Though not illustrated in FIG. 12, if the majority of index groups are generated, the receiving device 120 sequentially performs decoding on respective indexes included in the majority of index groups in accordance with the scheme depicted in FIG. 3A.

In step 1220, the receiving device 120 determines if an index of a bit on which decoding is performed corresponds to a position of performing a CRC check. In other words, the receiving device 120 decides if decoding on bits corresponding to one index group has been all performed. If the index of the bit on which the decoding is performed does not correspond to the position of performing the CRC check, in step 1230, the receiving device 120 sequentially performs decoding from a next index. If the index of the bit on which the decoding is performed corresponds to the position of performing the CRC check, in step 1240, the receiving device 120 performs the CRC check for a 1st candidate group of the index group.

In step 1250, the receiving device 120 decides a 2nd candidate group passing the CRC check. The receiving device 120 repeatedly performs step 1220 to step 1250 until a decoding path for the last index group among the majority of index groups is decided. Though not illustrated in FIG. 12, if the 2nd candidate group of the last index group is decided, the receiving device 120 decides one candidate of high metric among a majority of candidates included in the 2nd candidate group, by bit values corresponding to indexes of the input information bits.

Figure 13:
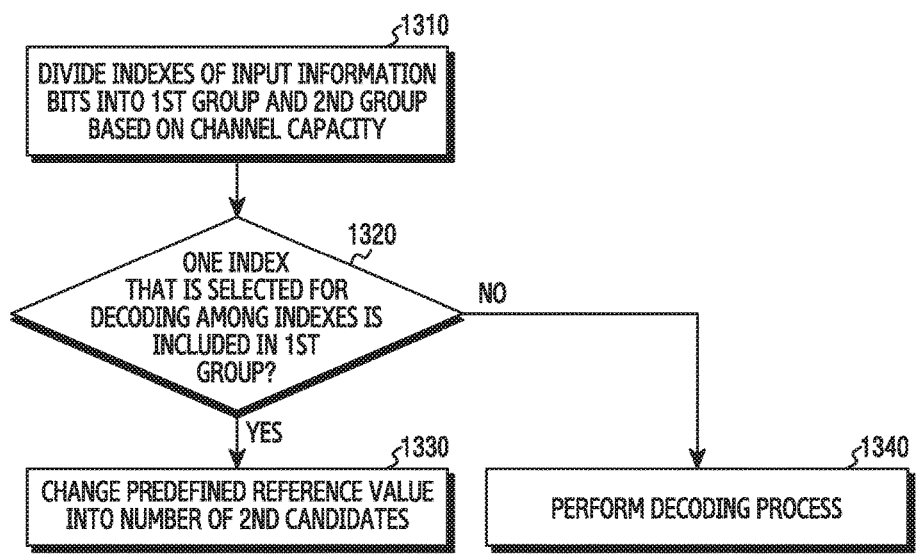
FIG. 13 illustrates a flow of a detailed operation for decoding of a polar code according to one exemplary embodiment.

FIG. 13 illustrates a flow of a detailed operation for decoding of a polar code according to one exemplary embodiment.

Referring to FIG. 13, in step 1310, the receiving device 120 divides indexes of input information bits into a 1st group and a 2nd group, based on a channel capacity or a decoding success rate. The 1st group represents a group of high channel capacity, and the 2nd group represents a group of a non-high channel capacity.

In step 1320, the receiving device 120 decides if one index that is selected for decoding among the indexes is included in the 1st group. If the index is included in the 1st group, in step 1330, the receiving device 120 decides the number of candidates included in a 1st candidate group related with the selected index, based on a result of a CRC check performed prior to the above CRC check. In other words, the receiving device 120 changes the 'L' into the number of decoding paths that are decided passing a CRC check in the previous step. If the index is not included in the 1st group, in step 1340, the receiving device 120 performs a decoding process for a bit value corresponding to each index identically with the scheme depicted in FIGS. 5A to 5C.

Figure 14:
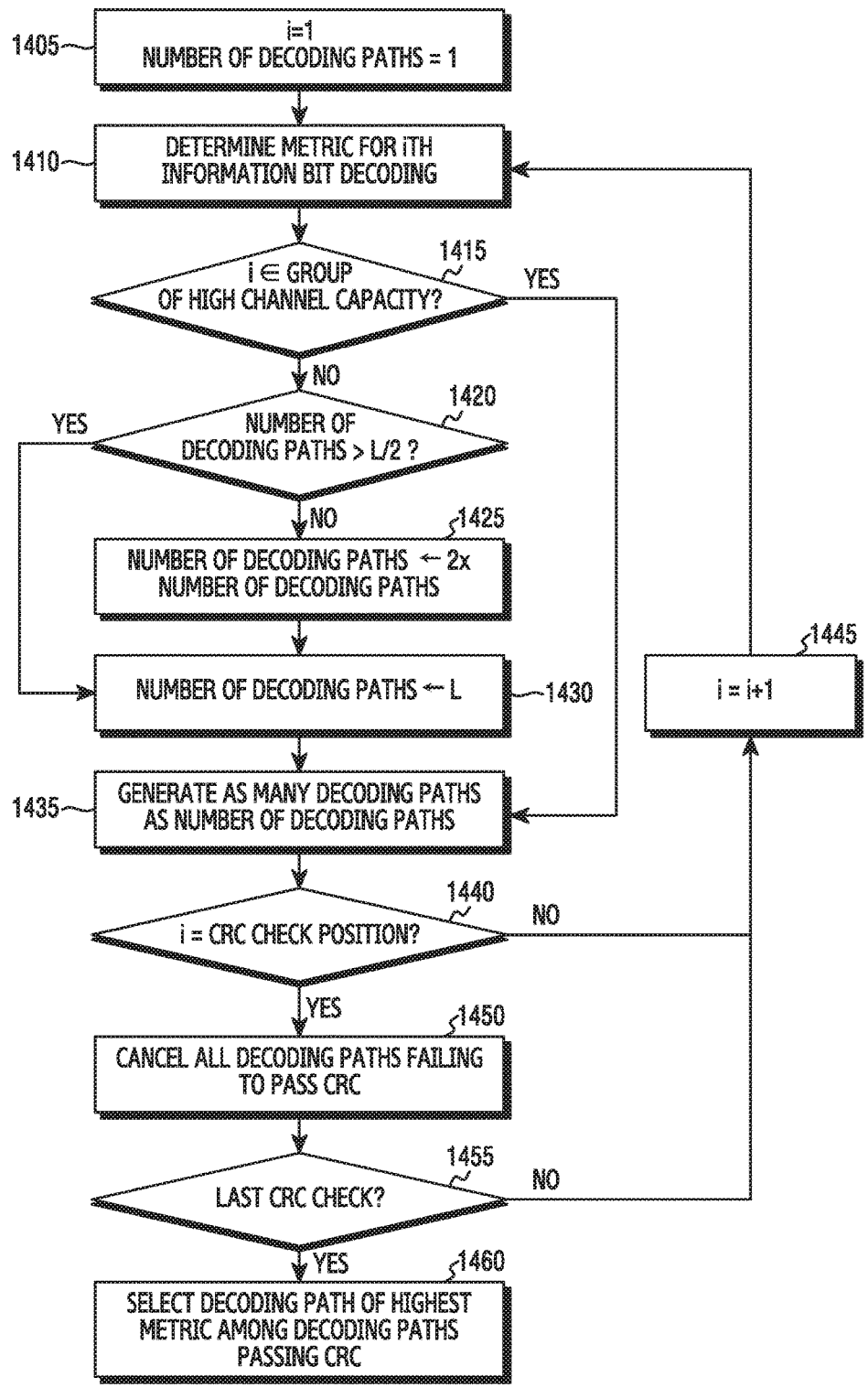
FIG. 14 illustrates a flow of an overall operation for decoding of a polar code according to one exemplary embodiment.

FIG. 14 illustrates a flow of an overall operation for decoding of a polar code according to one exemplary embodiment.

Referring to FIG. 14, in step 1405, the receiving device 120 sets 'i' by 1. Here, the 'i' denotes indexes of input information bits. Also, the receiving device 120 sets the number of decoding paths by 1. The decoding path may be referred to as a list or a codeword candidate. The decoding path is doubled whenever decoding on one index is performed. To decide decoding paths for an information bit corresponding to the one index, the receiving device 120 successively performs step 1410 to step 1435 below.

In step 1410, the receiving device 120 determines a metric for decoding of an information bit corresponding to an $i^{th}$ index. In step 1415, the receiving device 120 decides if the index 'i' for performing decoding is included in a group of high channel capacity. If the 'i' is included in the group of high channel capacity, in step 1435, the receiving device 120 generates as many decoding paths as the current number of decoding paths. In other words, the receiving device 120 maintains the number of decoding paths decided in the previous step as it is, without increasing the number of decoding paths.

If the 'i' is not included in the group of high channel capacity, the receiving device 120 performs a decoding path generation process as below. In step 1420, the receiving device 120 decides if the current number of decoding paths exceeds L/2 ('L' is a decoding path reference value). If the current number of decoding paths exceeds the L/2, in step 1430, the receiving device 120 decides the current number of decoding paths as the 'L'. If the current number of decoding paths does not exceed the L/2, the receiving device 120 increases the current number of decoding paths by double in step 1425 and then, maintains the number of decoding paths as the 'L' in step 1430.

In step 1435, the receiving device 120 generates as many decoding paths as the decided number of decoding paths. Through a series of processes, the number of decoding paths may be maintained as the number of decoding paths of the previous step, or may be generated as many as the 'L' based on whether the index 'i' is included in the group of high channel capacity.

In step 1440, the receiving device 120 decides if the index 'i' generating the decoding paths is an index for performing a CRC check. In other words, as mentioned in step 1220 of FIG. 12, the receiving device 120 determines if decoding on bits in which one index corresponds to a group have been all performed. If the index 'i' does not correspond to the index for performing the CRC check, in step 1445, the receiving device 120 increases a value of the index 'i' by 1. In other words, the receiving device 120 will perform the mentioned decoding path generation process (step 1410 to step 1435) for a next index. If the index 'i' corresponds to the index for performing the CRC check, in step 1450, the receiving device 120 cancels decoding paths failing to pass the CRC check among a majority of decoding paths. The receiving device 120 no longer performs decoding on the canceled decoding paths.

In step 1455, the receiving device 120 determines if a current CRC check is the last CRC check. In other words, as illustrated in FIG. 12, the receiving device 120 determines if a decoding path for the last index group among a majority of index groups is decided. If the current CRC check is not the last CRC check, in step 1445, the receiving device 120 increases a value of the index 'i' by 1, and performs a next decoding step. If the current CRC check is the last CRC check, in step 1460, the receiving device 120 selects one decoding path of high metric in order to decide final bits corresponding to indexes of input bits. The metric may be a likelihood or an LLR.

Figure 15:
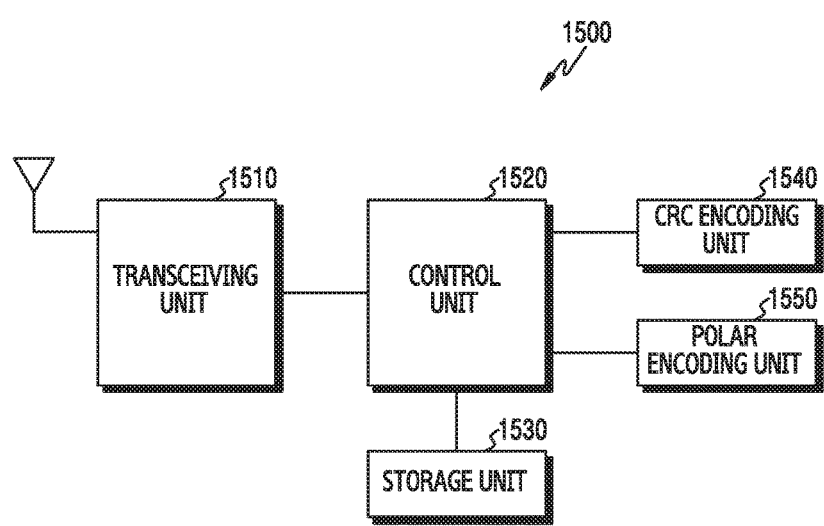
FIG. 15 illustrates a functional construction of an electronic device according to one exemplary embodiment.

FIG. 15 illustrates a functional construction of an electronic device 1500 according to one exemplary embodiment. The terms " . . . unit", " . . . er", etc. used below may represent the unit of processing at least one function or operation, and the terms may represent hardware, software or a combination of the hardware and the software.

Referring to FIG. 15, the electronic device 1500 includes a transceiving unit 1510, a control unit 1520, a storage unit 1530, a CRC encoding unit 1540 and a polar encoding unit 1550. In some embodiments, the transceiving unit 1510 may be referred to as a transmission interface, a reception interface, a transmission and reception interface, a transmitter, a receiver, or a transceiver. In other some embodiments, the control unit 1520 may be referred to as a controller or a processor. For description convenience, FIG. 15 illustrates the electronic device 1500 including only the above constituent elements, but deleting of the constituent elements or adding of new constituent elements is available in accordance with various implementation methods. Also, for description convenience, FIG. 15 illustrates including one element per constituent element, but may include at least two or more constituent elements in accordance with various implementation methods. For example, the electronic device 1500 may include two or more control units 1520 or two or more storage units 1530. Also, for description convenience, FIG. 15 illustrates that the electronic device 1500 performs a function of the transmitting device 110, but the electronic device 1500 may perform a function of the receiving device 120 or may perform all the functions of the transmitting device 110 and the receiving device 120 in accordance with an implementation method.

The transceiving unit 1510 is configured to perform a function of processing a transceived signal. In some exemplary embodiments, the transceiving unit 1510 is configured to perform various operations for processing a transmission signal in a baseband. For example, the transceiving unit 1510 may be configured to perform modulation based on a modulation scheme according to a communication system. The modulation scheme may include Code Division Multiple Access (CDMA), Wideband Code Division Multiple Access (WCDMA), an orthogonal scheme (for example, Orthogonal Frequency Division Multiplexing (OFDM)), and a non-orthogonal scheme (for example, Filter Bank Multi-carrier (FBMC)), as well as Hybrid Frequency Shift Keying and Quadrature Amplitude Modulation (FQAM), Sliding Window Superposition Coding (SWSC), Filter Bank Multi Carrier (FBMC), Non Orthogonal Multiple Access (NOMA), Sparse Code Multiple Access (SCMA) and the like.

In some other exemplary embodiments, the transceiving unit 1510 is configured to perform various operations for transmitting a transmission signal processed in the baseband, as a Radio Frequency (RF) signal. For example, the transceiving unit 1510 may be configured to filter, based on a transmission band, an RF signal that is processed in the baseband and is converted into an analog signal by a Digital to Analog Converter (DAC). For another example, the transceiving unit 1510 may be configured to up convert the RF signal. The signal power of the up-converted RF signal is amplified by a Power Amplifier (PA). The amplified RF signal is transmitted through an antenna included in the electronic device 1500.

In accordance with an implementation method, the transceiving unit 1510 is configured to perform an operation for receiving a signal. If the electronic device 1500 performs an operation for receiving a signal, the transceiving unit 1510 may be configured to filter and down-convert a signal received through an antenna, and may be configured to demodulate the down-converted signal in a baseband.

The control unit 1520 may include one processor core or include a plurality of processor cores. In some exemplary embodiments, the control unit 1520 may include a multi core such as a dual core, a quad core, a hexa core, etc. In some other exemplary embodiments, the control unit 1520 may further include a cache memory that is located inside or outside.

To perform various functions of the electronic device 1500, the control unit 1520 may be operatively combined with the other constituent elements. In some exemplary embodiments, the control unit 1520 is configured to control the transceiving unit 1510 in order to process a transmitted signal. In some other exemplary embodiments, the control unit 1520 is configured to store a received signal or data in the storage unit 1530, or read or load.

The storage unit 1530 may include at least one of a volatile memory or a nonvolatile memory. The nonvolatile memory may include a Read Only Memory (ROM), a Programmable ROM (PROM), an Electrically Programmable ROM (EPROM), an Electrically Erasable PROM (EEPROM), a flash memory, a Phase-change RAM (PRAM), a Magnetic RAM (MRAM), a Resistive RAM (RRAM), a Ferroelectric RAM (FRAM), etc. The volatile memory may include at least one of various memories such as a Dynamic RAM (DRAM), a Static RAM (SRAM), a Synchronous DRAM (SDRAM), a Phase-change RAM (PRAM), a Magnetic RAM (MRAM), a Resistive RAM (RRAM), a Ferroelectric RAM (FRAM), etc. Also, the storage unit 1530 may include nonvolatile media such as a Hard Disk Drive (HDD), a Solid State Disk (SSD), an embedded MultiMedia Card (eMMC), and a Universal Flash Storage (UFS).

The CRC encoding unit 1540 and the polar encoding unit 1550 are configured to perform various operations for polar encoding. For description convenience, FIG. 15 illustrates that the CRC encoding unit 1540 and the polar encoding unit 1550 perform independent functions respectively, but in accordance with an implementation method, the CRC encoding unit 1540 and the polar encoding unit 1550 may be configured as one hardware or one software. Also, in accordance with an implementation method, the CRC encoding unit 1540 and the polar encoding unit 1550 may be located outside the control unit 1520, or may be located inside the control unit 1520.

The CRC encoding unit 1540 is configured to perform various operations for CRC encoding. In some exemplary embodiments, the CRC encoding unit 1540 is configured generate a majority of bit groups by dividing input information bits into a predefined count. The predefined count may be decided based on at least one of a length of the input information bit sequence and a coding rate. Also, the CRC encoding unit 1540 is configured to generate one CRC codeword by performing the CRC encoding on each of the majority of bit groups.

The CRC encoding unit 1540 is configured to perform the CRC encoding in accordance with various schemes. For example, the CRC encoding unit 1540 may be configured to generate a 1st CRC codeword by performing CRC encoding on the first bit group among the majority of bit groups, and generate a 2nd CRC codeword by performing CRC encoding on the second bit group among the majority of bit groups. The CRC encoding unit 1540 may be configured to generate one CRC codeword by concatenating the 1st CRC codeword and the 2nd CRC codeword.

For another example, the CRC encoding unit 1540 may be configured to generate a 1st CRC codeword by performing CRC encoding on the first bit group among the majority of bit groups, and generate one CRC codeword by concatenating the second bit group among the majority of bit groups and the 1st CRC codeword and performing CRC encoding for the 1st CRC codeword that the second bit group is concatenated with.

For description convenience, only a CRC encoding operation for the first bit group and the second bit group among the majority of bit groups has been described, but the CRC encoding unit 1540 may perform the CRC encoding on all the majority of bit groups in accordance with the above scheme.

The polar encoding unit 1550 is configured to generate a polar codeword by performing polar encoding on the CRC codeword in accordance with various schemes. The generated polar codeword is transmitted from the electronic device 1500 through the transceiving unit 1510.

FIG. 15 illustrates that the CRC encoding unit 1540 and the polar encoding unit 1550 perform the CRC encoding and the polar encoding, but the CRC encoding unit 1540 and the polar encoding unit 1550 are configured to perform CRC check and encoding of a polar code respectively when the electronic device 1500 performs a function of receiving a signal like the receiving device 120.

In some exemplary embodiments, the polar encoding unit 1550 is configured to decide a 1st candidate group by decoding a bit value corresponding to one index that is selected among a majority of indexes. The majority of indexes correspond to a majority of bits that are included in an input information bit sequence. Also, the polar encoding unit 1550 is configured to decide a 2nd candidate group passing the CRC check among the 1st candidate group.

Also, the polar encoding unit 1550 is configured to divide the indexes into a 1st group of high channel capacity and a 2nd group of low channel capacity, based on a channel capacity. If one index that is selected for decoding among the indexes is included in the 1st group, the polar encoding unit 1550 is configured to decide the number of candidates included in the 1st candidate group related with the selected index, based on a result of a CRC check performed prior to the above CRC check.

In some exemplary embodiments, the CRC encoding unit 1540 is configured to decide a 2nd candidate group passing the CRC check among the 1st candidate group. Also, the CRC encoding unit 1540 is configured to decide one candidate among a majority of candidates that are included in the 2nd candidate group, based on a metric. The metric may correspond to a likelihood or an LLR. The CRC encoding unit 1540 is configured to decide, by the bit values corresponding to the indexes, one candidate of highest likelihood or LLR among the majority of candidates included in the 2nd candidate group. Also, the CRC encoding unit 1540 is configured to, if the 1st candidate group of one index group among the majority of index groups is decided, perform the CRC check, and decide the 2nd candidate group passing the CRC check. Also, the CRC encoding unit 1540 is configured to, if the 1st candidate group of the last index group among the majority of index groups is decided, perform the CRC check, and decide the 2nd candidate group passing the CRC check, and decide, by the bit values corresponding to the indexes, one candidate among the majority of candidates included in the 2nd candidate group, based on the metric. Also, the CRC encoding unit 1540 is configured to terminate the decoding operation if the number of candidates included in the 2nd candidate group is zero after the CRC check.

As mentioned earlier, the CRC encoding unit 1540 and the polar encoding unit 1550 may be configured to perform the aforementioned operations independently of the control unit 1520, but if the CRC encoding unit 1540 and the polar encoding unit 1550 are located within the control unit 1520, the control unit 1520 may be configured to control the aforementioned operations of the CRC encoding unit 1540 and the polar encoding unit 1550.

Figure 16A:
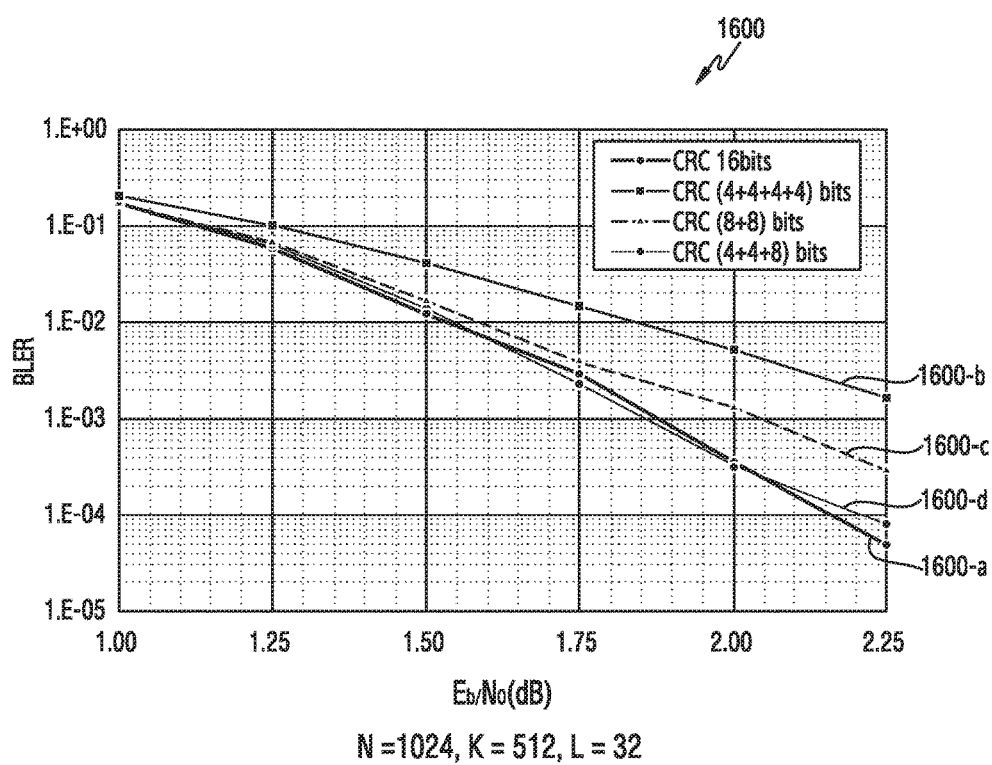
FIGS. 16A and 16B illustrate the error rate performance of a CRC polar code technology according to one exemplary embodiment.
Figure 16B:
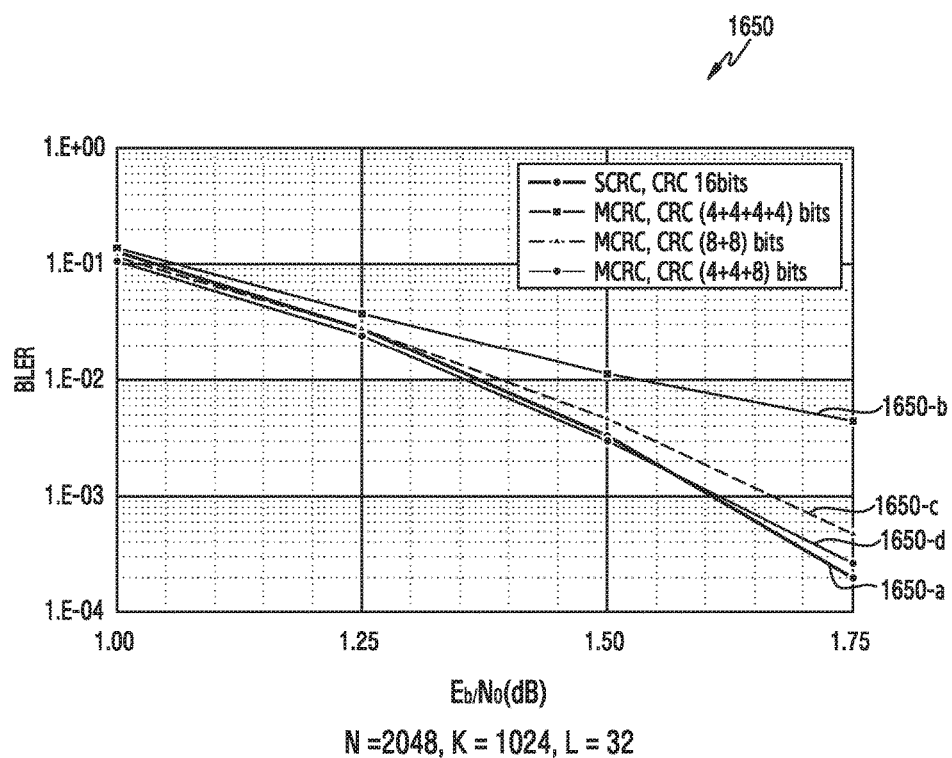

FIGS. 16A and 16B illustrate the error rate performance of a CRC polar code technology according to one exemplary embodiment. FIGS. 16A and 16B are to compare error rate performance and complexity compared to an SCRC polar code technology and an MCRC polar code technology, respectively.

FIG. 16A illustrates a result of setting a length of a polar code N=1024, a length of an input information bit K=512, and the number of decoding paths L=32 and measuring the performance of a block error rate. Referring to FIG. 16A, a horizontal axis of a graph 1600 denotes a bit energy for a noise power density of a signal received by the receiving device 120. The unit of the bit energy is decibel (dB). A vertical axis of the graph 1600 denotes a BLock Error Rate (BLER) of a signal received by the receiving device 120. Reference numerals 1600-a to 1600-d included in the graph 1600 each denote the block error rate performance of an operation method that applies a CRC code of 16 bits in accordance with various schemes. The reference numeral 1600-a denotes the block error rate performance of an operation method that applies a single CRC code of a length of 16 bits. The reference numeral 1600-a denotes the block error rate performance of an operation method that generates four CRC codes of a length of 4 bits and applies a multiple CRC code. The reference numeral 1600-c denotes the block error rate performance of an operation method that applies a multiple CRC code by generating two CRC codes of a length of 8 bits. The reference numeral 1600-d denotes the block error rate performance of an operation method that applies a multiple CRC code by generating two CRC codes of a length of 4 bits and one CRC code of a length of 8 bits. In a case of the reference numeral 1600-d, after the receiving device 120 divides indexes of input information bits into two groups in accordance with a channel capacity, the receiving device 120 maintains the number of decoding paths for a group of high channel capacity, and increases or decreases the number of decoding paths for a group of low channel capacity. Similarly with the reference numeral 1600-a, the reference numeral 1600-d denotes the block error rate performance. In contrast, the reference numeral 1600-b and the reference numeral 1600-c denote a higher block error rate performance than the reference numeral 1600-a. In other words, the graph 1600 shows that the error rate performance of the operation method constantly applying the multiple CRC code causes degenerated performance compared to the operation method applying the single CRC code, whereas the operation method applying the CRC code by dividing by two groups represents similar error rate performance with the operation method applying the single CRC code.

The operation complexity for each of the operation methods is given as follows.

TABLE 1

| Technique | Operation complexity compared to SCRC |
| --- | --- |
| CRC 16 bits | 100% |
| CRC 4 + 4 + 4 + 4 bits | 99.6% |
| CRC 8 + 8 bits | 99.7% |
| CRC 4 + 4 + 8 bits | 76.1% |

Referring to Table 1, assuming that the operation complexity of the operation method applying the single CRC code is 100%, the operation complexity of the operation method applying the multiple CRC code is lower than the operation complexity of the operation method applying the single CRC code. But, a difference of the operation complexity of the operation method constantly applying the CRC code and the operation complexity of the operation method applying the single CRC code was less than 1%, whereas the operation complexity of the operation method adaptively applying the CRC code was decreased 20% or more.

Referring to FIG. 16B, a graph 1650 shows a result of measuring block error rate performance by setting a length of a polar code N=2048, a length of an input information bit K=1024, and the number of decoding paths L=32. Identically with the reference numerals included in the graph 1600, reference numerals 1650-a to 1650-d included in the graph 1650 denote the block error rate performance of an operation method applying a single CRC code of a length of 16 bits, an operation method applying a multiple CRC code by generating four CRC codes of a length of 4 bits, an operation method applying a multiple CRC code by generating two CRC codes of a length of 8 bits, and an operation method applying a multiple CRC code by generating two CRC codes of a length of 4 bits and one CRC code of a length of 8 bits, respectively. The operation complexity for each of the operation methods is given as follows.

TABLE 2

| Technique | Operation complexity compared to SCRC |
| --- | --- |
| CRC 16 bits | 100% |
| CRC 4 + 4 + 4 + 4 bits | 99.7% |
| CRC 8 + 8 bits | 99.8% |
| CRC 4 + 4 + 8 bits | 81.1% |

The graph 1650 and Table 2 all show similar measurement results with the graph 1600 and Table 1. In other words, even if a length of a polar code and a length of an input information bit are changed, the operation method adaptively applying the multiple CRC code provides similar block error rate performance with the operation method applying the single CRC code. Also, the operation method adaptively applying the multiple CRC code provides a low operation complexity compared to the operation method applying the single CRC code and the operation method applying the multiple CRC code.

Methods according to exemplary embodiments mentioned in claims or specification of the present disclosure may be implemented in the form of hardware, software, or a combination of the hardware and the software. If the methods are implemented by software, a computer-readable storage medium storing one or more programs (i.e., software modules) may be provided. The one or more programs stored in the computer-readable storage medium are configured to be executable by one or more processors within an electronic device. The one or more programs include instructions for enabling the electronic device to execute the methods according to the exemplary embodiments stated in the claims or specification of the present disclosure.

This program (i.e., a software module and software) may be stored in a Random Access Memory (RAM), a non-volatile memory including a flash memory, a Read Only Memory (ROM), an Electrically Erasable Programmable Read Only Memory (EEPROM), a magnetic disc storage device, a Compact Disc-ROM (CD-ROM), a Digital Versatile Disc (DVD) or an optical storage device of another form, and a magnetic cassette. Or, the program may be stored in a memory that is constructed in combination of some or all of them. Also, each constructed memory may be included in plural as well.

Further, the program may be stored in an attachable storage device that may gain access through a communication network such as the Internet, an intranet, a Local Area Network (LAN), a Wireless LAN (WLAN) or a Storage Area Network (SAN), or a communication network constructed in combination of them. This storage device may connect to a device performing an exemplary embodiment of the present disclosure through an external port. Also, a separate storage device on the communication network may connect to the device performing the exemplary embodiment of the present disclosure.

In the aforementioned concrete exemplary embodiments of the present disclosure, constituent elements included in the disclosure have been expressed in a singular form or plural form in accordance to a proposed concrete exemplary embodiment. But, the expression of the singular form or plural form is selected suitable to a proposed situation for description convenience, and it is not that the present disclosure is limited to singular or plural constituent elements. Even a constituent element expressed in the plural form may be constructed in the singular form, or even a constituent element expressed in the singular form may be constructed in the plural form.

By maintaining the number of decoding paths in encoding and decoding with a CRC and a polar code, exemplary embodiments of the present disclosure may decrease the number of operations.

Although the present disclosure has been described with an exemplary embodiment, various changes and modifications may be suggested to one skilled in the art. It is intended that the present disclosure encompass such changes and modifications as fall within the scope of the appended claims.

In the above-described detailed embodiments of the present disclosure, a component included in the present disclosure is expressed in the singular or the plural according to a presented detailed embodiment. However, the singular form or plural form is selected for convenience of description suitable for the presented situation, and various embodiments of the present disclosure are not limited to a single element or multiple elements thereof. Further, either multiple elements expressed in the description may be configured into a single element or a single element in the description may be configured into multiple elements.

Embodiments of the present invention according to the claims and description in the specification can be realized in the form of hardware, software or a combination of hardware and software.

Such software may be stored in a computer readable storage medium. The computer read able storage medium stores one or more programs (software modules), the one or more programs comprising instructions, which when executed by one or more processors in an electronic device, cause the electronic device to perform methods of the present invention.

Such software may be stored in the form of volatile or non-volatile storage such as, for example, a storage device like a Read Only Memory (ROM), or in the form of memory such as, for example, Random Access Memory (RAM), memory chips, device or integrated circuits or on an optically or magnetically readable medium such as, for example, a Compact Disc (CD), Digital Video Disc (DVD), magnetic disk or magnetic tape or the like. It will be appreciated that the storage devices and storage media are embodiments of machine-readable storage that are suitable for storing a program or programs comprising instructions that, when executed, implement embodiments of the present invention. Embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

What is claimed is:

1. A method for operating a receiving device in a wireless system, the method comprising:
   receiving a polar codeword generated by a polar code;
   generating a majority of decoding paths by decoding a bit value corresponding to one index that is selected among a majority of indexes indicating respective bits included in the polar codeword;
   determining a first candidate group that includes at least one decoding path among the majority of decoding paths; and
   determining, as a second candidate group, at least one decoding path passing a first cyclic redundancy check (CRC) check among the first candidate group,
   wherein a number of the at least one decoding path included in the first candidate group is determined based on a result of a second CRC check performed prior to the first CRC check, and
   wherein the second CRC check is performed after decoding another bit value corresponding to another index among the majority of indexes.

2. The method of claim 1, wherein the polar codeword is divided into a majority of index groups, and
   the first CRC check is performed on a per-divided-index-group basis.

3. The method of claim 2, wherein a number of the majority of index groups is determined based on a length of the polar codeword and a coding rate.

4. The method of claim 2, further comprising:
   if the first candidate group of a last index group among the majority of index groups is determined, performing the first CRC check for the at least one decoding path included in the first candidate group of the last index group;
   determining, as the second candidate group, the at least one decoding path passing the first CRC check among the first candidate group of the last index group; and
   if a number of decoding paths passing the first CRC check is two or more, determining, as a final decoding result, one decoding path among the two or more decoding paths based on a metric.

5. The method of claim 4, wherein the metric corresponds to a likelihood or a log likelihood ratio (LLR), and
   wherein the determining of the one decoding path comprises determining one decoding path of a highest likelihood or LLR among the two or more decoding paths included in the second candidate group.

6. The method of claim 1, further comprising, if a number of decoding paths included in the second candidate group is zero after the first CRC check, terminating the decoding.

7. The method of claim 1, wherein the majority of indexes are classified into a first group and a second group based on a channel capacity, and
   if the selected one index is included in the first group, the number of the at least one decoding path included in the first candidate group is determined based on a result of a third CRC check performed prior to the first CRC check.

8. The method of claim 7, wherein if one index that is selected for the decoding among the majority of indexes is included in the second group, the number of the at least one decoding path included in the first candidate group is determined based on a predefined reference value.

9. A receiving device in a wireless system, the receiving device comprising:
   a transceiver configured to receive a signal from a transmitting device; and
   at least one processor operatively combined with the transceiver,
   wherein the at least one processor is configured to:
      receive a polar codeword generated by a polar code,
      generate a majority of decoding paths by decoding a bit value corresponding to one index that is selected among a majority of indexes indicating respective bits included in the polar codeword,
      determine a first candidate group that includes at least one decoding path among the majority of decoding paths, and
      determine, as a second candidate group, at least one decoding path passing a first cyclic redundancy check (CRC) check among the first candidate group,
   wherein a number of the at least one decoding path included in the first candidate group is determined based on a result of a second CRC check performed prior to the first CRC check, and
   wherein the second CRC check is performed after decoding another bit value corresponding to another index among the majority of indexes.

10. The receiving device of claim 9, wherein the polar codeword is divided into a majority of index groups, and
    the first CRC check is performed on a per-divided-index-group basis.

11. The receiving device of claim 10, wherein a number of the majority of index groups is determined based on a length of the polar codeword and a coding rate.

12. The receiving device of claim 10, wherein the at least one processor is further configured to:
    if the first candidate group of a last index group among the majority of index groups is determined, perform the first CRC check for the at least one decoding path included in the first candidate group of the last index group,
    determine, as the second candidate group, the at least one decoding path passing the first CRC check among the first candidate group of the last index group, and
    if a number of decoding paths passing the first CRC check is two or more, determine, as a final decoding result, one decoding path among the two or more decoding paths based on a metric.

13. The receiving device of claim 12, wherein the metric corresponds to a likelihood or a log likelihood ratio (LLR), and
    wherein the at least one processor is configured to determine one decoding path of a highest likelihood or LLR among the two or more decoding paths included in the second candidate group.

14. The receiving device of claim 9, wherein the at least one processor is further configured to, if a number of decoding paths included in the second candidate group is zero after the first CRC check, terminate the decoding.

15. The receiving device of claim 9, wherein the majority of indexes are classified into a first group and a second group based on a channel capacity, and if the selected one index is included in the first group, the at least one processor is configured to determine the number of the at least one decoding path included in the first candidate group based on a result of a third CRC check performed prior to the first CRC check.

16. The receiving device of claim 15, wherein if one index that is selected for the decoding among the majority of indexes is included in the second group, the at least one processor is configured to determine the number of the at least one decoding path included in the first candidate group based on a predefined reference value.

17. The receiving device of claim 9, wherein a number of the at least one decoding path included in the second candidate group is a number of all decoding paths passing the first CRC check or the number of decoding paths selected as many as a predefined count among the decoding paths passing the first CRC check.

18. The receiving device of claim 9, wherein the at least one processor is further configured to:

measure a metric of decoding paths that are generated by the second CRC check performed prior to the first CRC check, if the measured metric is equal to or is greater than a predefined threshold value, determine a number of decoding paths for the selected index based on a result of the second CRC check performed prior to the first CRC check, and if the measured metric is less than the predefined threshold value, determine the number of decoding paths for the selected index based on a predefined reference value.

19. A transmitting device in a wireless system, the transmitting device comprising:

a transceiver configured to perform communication with a receiving device; and at least one processor operatively combined with the transceiver, wherein the at least one processor is configured to:

generate a majority of bit groups by dividing input information bits every predefined count, generate a first CRC codeword by performing CRC encoding on a first bit group among the majority of bit groups, concatenate a second bit group among the majority of bit groups and the first CRC codeword, and generate a second CRC codeword by performing the CRC encoding on the first CRC codeword that the second bit group is concatenated with.

20. The transmitting device of claim 19, wherein the predefined count is determined based on a length of the input information bits and a coding rate.

\* \* \* \* \*